(12) United States Patent
Hwang et al.

(10) Patent No.: US 6,589,848 B1
(45) Date of Patent: Jul. 8, 2003

(54) PHOTODETECTOR DEVICE AND METHOD FOR MANUFACTURING THE SAME

(75) Inventors: Woong-lin Hwang, Kunpo (KR); Jun-young Kim, Kunpo (KR)

(73) Assignee: Samsung Electronics Co., Ltd., Suwon (KR)

( * ) Notice: Subject to any disclaimer, the term of this patent is extended or adjusted under 35 U.S.C. 154(b) by 137 days.

(21) Appl. No.: 09/614,588

(22) Filed: Jul. 12, 2000

(30) Foreign Application Priority Data

Jul. 12, 1999 (KR) ........................................ 1999-27990

(51) Int. Cl.$^7$ ............................................ H01L 21/331
(52) U.S. Cl. ........................ 438/319; 438/88; 438/125; 136/249; 250/208.1; 250/211; 356/2; 356/30; 356/90
(58) Field of Search .......................... 438/319, 88, 125; 250/208.1, 211; 136/249; 356/30, 2, 90

(56) References Cited

U.S. PATENT DOCUMENTS

| | | | | |
|---|---|---|---|---|
| 4,598,306 A | * | 7/1986 | Nath et al. ..................... | 357/30 |
| 5,001,335 A | * | 3/1991 | Takaoka et al. ............ | 250/211 |
| 5,262,633 A | * | 11/1993 | Kasai et al. .............. | 250/208.1 |
| 5,296,045 A | * | 3/1994 | Banerjee et al. ............ | 136/249 |
| 5,478,757 A | * | 12/1995 | Lee ................................. | 437/2 |
| 5,665,423 A | * | 9/1997 | Lee ............................... | 438/88 |

* cited by examiner

Primary Examiner—Vu A. Le
Assistant Examiner—Pho M. Luy
(74) Attorney, Agent, or Firm—Robert E. Bushnell, Esq.

(57) ABSTRACT

A photodetector device and a process for manufacturing the same are described. The photodetector device comprises a doped semiconductor substrate; an intrinsic semiconductor material layer formed over the substrate, for absorbing incident light; an upper semiconductor material layer doped with the opposite type to the substrate, formed on a portion of the intrinsic semiconductor material layer to allow at least a portion of the incident light to directly enter the intrinsic semiconductor material layer; an upper electrode formed in a predetermined pattern on the upper semiconductor material layer, the upper electrode electrically connected to the upper semiconductor material layer; and a lower electrode electrically connected to the substrate, wherein a portion of the intrinsic semiconductor material layer constitutes at least a part of a photo-receiving surface. The photodetector device has a photo-receiving surface, which is formed by removing all or a portion of the upper semiconductor material layer within a photo-receiving area, which allows at least a portion of the incident light to directly enter the intrinsic semiconductor material layer, thereby reducing capacitance even with a relatively large photo-receiving surface.

22 Claims, 7 Drawing Sheets

PHOTODETECTOR DEVICE AND METHOD FOR MANUFACTURING THE SAME

CLAIM OF PRIORITY

This application makes reference to, incorporates the same herein, and claims all benefits accruing under 35 U.S.C. §119 from the inventor's application PHOTODETECTOR DEVICE AND METHOD FOR MANUFACTURING THE SAME filed with the Korean Industrial Property Office on the day of Jul. 12, 1999 and there duly assigned Ser. No. 27990/1999.

BACKGROUND OF THE INVENTION

1. Field of the Invention

The present invention relates to optoelectric devices and processes for manufacturing optoelectric devices. More particularly, the invention relates to photodetector devices, and processes for manufacturing photodetector devices, with relatively large photo-receiving areas that are capable of providing high-speed responses.

2. Description of the Related Art

Optical data communications such as optical interconnections, require optical signal sending and receiving units, such as light emitters that produce optical signals and photodetectors that detect the optical signals that have been generated by light emitters. As the need for high speed transmission increases, optical interconnections for communications through local area networks (LANs), computer-to-computer, computer-to-peripheral device, board-to-board, and chip-to chip, have replaced conventional copper wire.

To meet the requirement for high speed transmission, optical interconnection needs a rapidly responsive photodetector, which is characterized by a small photo-receiving area and low capacitance. Conventional P-I-N photodetectors tend to be integrated on a n-type substrate beginning with an n-type semiconductor layer, upon which an intrinsic (that is, an undoped) semiconductor layer and a p-type semiconductor layer are stacked in sequence. A meta annular p-electrode will be formed on the top of the p-type semiconductor layer, and an n-electrode may be formed on the back side of the substrate. With other designs of conventional P-I-N photodetectors, the P-I-N structure is implemented on the n-type substrate by diffusion.

One of the factors determining the capacitance of such a P-I-N photodetector is the characteristics of the materials used to construct the photodetector. For example, a P-I-N photodetector made of Si has even less capacitance than one formed of GaAs. The intrinsic semiconductor layer must be formed as thick as 10 to 20 $\mu$m. because the indirect transition bandgap of Si reduces absorbency. Thus, for high speed response, a high voltage of 10V or more is needed. For this reason, a photodetector made of Si is inappropriate in application fields which need high speed response with a low voltage. In contrast, because GaAs has a direct transition bandgap, the intrinsic semiconductor layer can be formed to have a thickness of 2 to 4 $\mu$m, and thus the photodetector is operable with a low voltage. The speed of response is limited however, because GaAs has a high dielectric constant; consequently the capacitance of the photodetector is high.

Another factor, which determines the capacitance of a photodetector, is the photo-receiving area. Capacitance is proportional to the photo-receiving area, and thus the capacitance can be lowered by reducing the photo-receiving area. When the photo-receiving area is reduced however, a lens for condensing incident light into a small photo-receiving surface is needed; this deleteriously increases the packaging cost, in addition to lowering the sensitivity of the device.

SUMMARY OF THE INVENTION

It is, therefore, an object of the present invention to provide an improved photodetector device and process for manufacturing photodetector devices.

It is another object to provide photodetector devices and processes for manufacturing photodetector devices with relatively large photo-receiving areas.

It is still another object to provide photodetector devices and processes for manufacturing photodetector devices that exhibit high speed responses.

It is yet another object to provide a photodetector device having a small capacitance and a high speed response even with a relatively large photo-receiving area, and a process for manufacturing the same.

It is yet another object to provide photodetector devices and processes having a high speed response without a concomitant increase in the packaging cost or a diminution of the sensitivity of the device.

According to one aspect of the present invention, a photodetector device is provided that may be constructed with a doped semiconductor substrate; an intrinsic semiconductor material layer formed over the substrate, for absorbing incident light; an upper semiconductor material layer doped with the opposite type to the substrate, formed on a portion of the intrinsic semiconductor material layer to allow at least a portion of the incident light to directly enter the intrinsic semiconductor material layer; an upper electrode formed in a predetermined pattern on the upper semiconductor material layer, the upper electrode electrically connected to the upper semiconductor material layer; and a lower electrode electrically connected to the substrate, wherein a portion of the intrinsic semiconductor material layer constitutes at least a part of a photo-receiving surface.

Preferably, the upper semiconductor material layer is formed only below the upper electrode. The upper semiconductor material layer may have a predetermined pattern on the photo-receiving surface. The photodetector device may further comprise a lower semiconductor material layer doped with the same type as the substrate, between the substrate and the intrinsic semiconductor material layer. Preferably, the substrate is formed of GaAs, InGaAs, or Si.

According to another aspect of the present invention, a process is provided for manufacturing a photodetector device, the process contemplates preparing a doped semiconductor substrate; forming an intrinsic semiconductor material layer over the substrate for absorbing incident light; forming an upper semiconductor material layer doped with the opposite type to the substrate, on a portion of the intrinsic semiconductor material layer through which at least a portion of the incident light directly enters the intrinsic semiconductor material layer, the portion of the intrinsic semiconductor material layer constituting at least a part of a photo-receiving surface; forming an upper electrode with a predetermined pattern on the upper semiconductor material layer, the upper electrode electrically connected to the upper semiconductor material layer; and forming a lower electrode electrically connected to the substrate.

Preferably, the upper semiconductor material layer is constructed by forming an upper semiconductor material layer over the intrinsic semiconductor material layer; and etching a portion of the upper semiconductor material layer, such that a portion of the surface of the intrinsic semiconductor material layer is exposed to serve as at least a part of the photo-receiving surface.

Preferably, the upper semiconductor material layer is etched to leave a portion of the upper semiconductor material layer being below the upper electrode. Preferably, the upper semiconductor material layer is etched to leave an upper semiconductor material pattern at the photo-receiving surface, and a portion of the upper semiconductor material layer being below the upper electrode. Preferably, between preparing the substrate and forming the intrinsic semiconductor material layer, the photodetector device manufacturing process further contemplates a step of forming a lower semiconductor material layer doped with the same type as the substrate, over the substrate.

BRIEF DESCRIPTION OF THE DRAWINGS

A more complete appreciation of the invention, and many of the attendant advantages, thereof, will be readily apparent as the same becomes better understood by reference to the following detailed description when considered in conjunction with the accompanying drawings in which like reference symbols indicate the same or similar components.

DETAILED DESCRIPTION OF THE INVENTION

Figure 1:
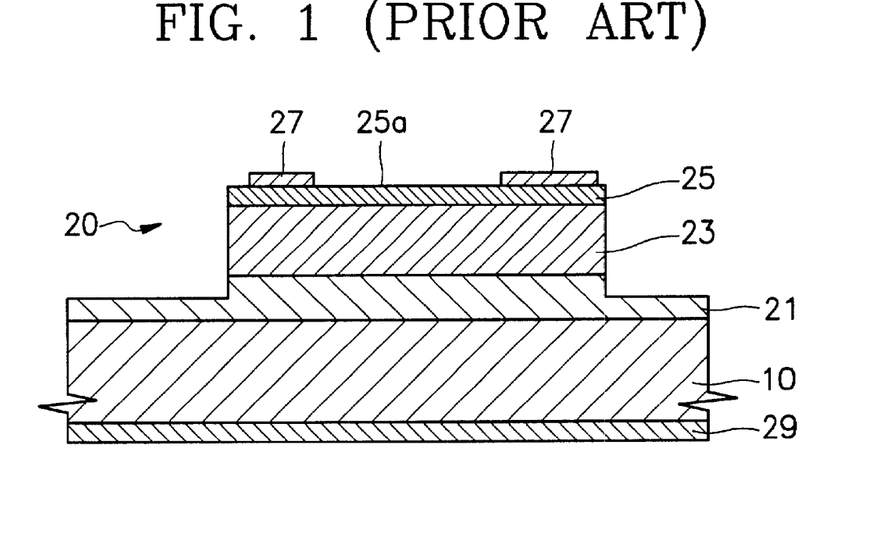
FIG. 1 is a sectional view of an example of one design of a P-I-N photodetector.

FIG. 1 shows a conventional P-I-N photodetector. The photodetector is integrated on an n-type substrate 10, beginning with an n-type semiconductor layer 21, upon which an intrinsic (i.e., undoped) semiconductor layer 23 and a p-type semiconductor layer 25 are stacked in sequence. On the top of p-type semiconductor layer 25, a meta annular p-electrode 27 is formed. Also, an n-electrode 29 is formed on the back side of substrate 10.

The photodetector has a mesa 20, which is etched around the outside of p-electrode 27 to a depth which extends just inside n-type semiconductor layer 21. The back side of substrate 10 is lapped to have a desired thickness. In order to avoid the occurrence of dark current, the exposed side walls of mesa 200 are covered with an insulating layer (not shown) or polyimide (not shown). For the conventional P-I-N photodetector, the top of p-type semiconductor layer 25, inside p-electrode 27, serves as a photo-receiving surface 25a.

Figure 2:
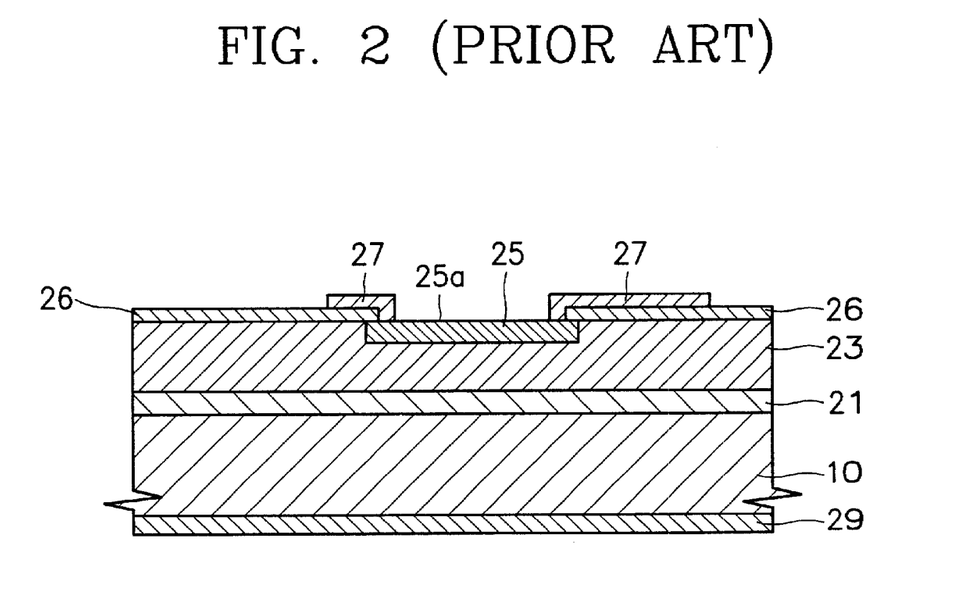
FIG. 2 is a sectional view of another example of another design of a P-I-N photodetector.

Another conventional P-I-N photodetector is shown in FIG. 2. In this case, the P-I-N structure is implemented on n-type substrate 10 by diffusion. For convenience and clarity, corresponding layers having like structures and functions are denoted by the same reference numerals as in FIG. 1. Reference numeral 26 represents an insulating layer between p-electrode 27 and intrinsic semiconductor layer 23.

In such conventional P-I-N photodetectors, as a reverse bias voltage is applied between p-electrode 27 and n-electrode 29, incident light enters p-type semiconductor layer 25 through photo-receiving surface 25a and is absorbed in intrinsic semiconductor layer 23 to produce electron and hole pairs. The electrons migrate toward n-electrode 29 while the holes migrate toward p-electrode 27, so that a current is detected in proportional to the amount of received light.

One of the factors determining the capacitance of such a P-I-N photodetector is the characteristics of the materials used to construct the photodetector. For example, a P-I-N photodetector made of Si has even less capacitance than one formed of GaAs. However, because the indirect transition bandgap of Si reduces absorbency, the intrinsic semiconductor layer must be formed as thick as 10 to 20 $\mu$m. Thus, for high speed response, a relatively high voltage of 10V or more is needed. For this reason, a photodetector made of Si is inappropriate in application fields which need a high-speed response with a low voltage. In contrast, because GaAs has a direct transition bandgap, the intrinsic semiconductor layer can be formed to have a thickness of 2 to 4 $\mu$m, and thus the photodetector is operable with a relatively low voltage. However, the capacitance of the photodetector is high, because GaAs has a high dielectric constant, which limits the response speed.

Another factor, which determines the capacitance of a photodetector, is the photo-receiving area. Capacitance is proportional to the photo-receiving area, and thus the capacitance can be lowered by reducing the photo-receiving area. However, when that is done, a lens for condensing incident light into a small photo-receiving surface, is needed, which increases the packaging cost, in addition to lowering sensitivity.

Figure 3:
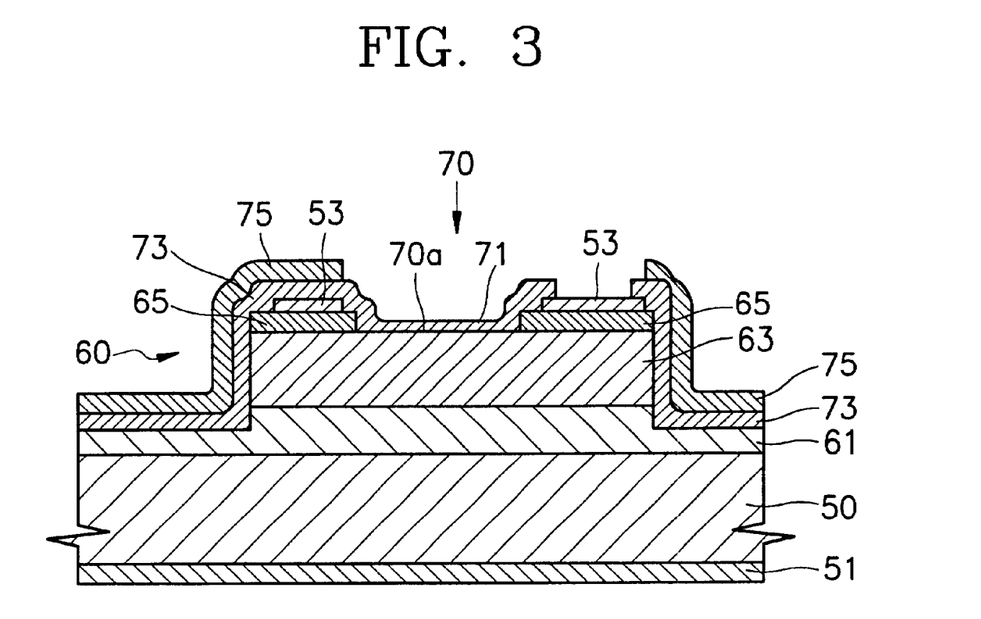
FIG. 3 is a sectional view showing an embodiment of a photodetector device constructed according to the principles of the present invention.

A preferred embodiment of a photodetector device according to the present invention is shown in FIG. 3. A photodetector device according to the present invention is preferably formed with GaAs or InGaAs, to achieve a high-speed response with a relatively low voltage. Alternatively, a photodetector device according to the present invention may be formed with Si or other materials. Referring to FIG. 3, the photodetector device is formed on a substrate 50, upon which a lower semiconductor material layer 61, an intrinsic semiconductor material layer 63, and an upper semiconductor material layer 65 are formed in sequence. Also, a lower electrode 51, which is electrically connected to substrate 50, is formed on the back side of substrate 50, and an upper electrode 53, which is electrically connected to the upper semiconductor material layer 65, is formed on upper semiconductor material layer 65.

In the present embodiment, substrate 50 is a semiconductor substrate formed of GaAs or InGaAs, which is doped to be n-type. Lower semiconductor material layer 61 and upper semiconductor material layer 65 are doped to be n-type and p-type, respectively. As shown in FIG. 3, photodetector device has a mesa 60, including upper semiconductor material layer 65, intrinsic semiconductor material layer 63 and just the top portion of lower semiconductor material layer 61. Here, mesa 60 may be formed by etching away the semiconductor material layers to the top portion of lower semiconductor material layer 61. Substrate 50 may be formed of Si.

The P-I-N structure of the photodetector device shown in FIG. 3 is implemented by epitaxial growth. Upper electrode 53, a metal electrode, is formed on upper semiconductor material layer 65 with a predetermined pattern having a predetermined width, for example, with an annular shape. In a photodetector device according to the present invention, the size of the photo-receiving surface is defined by upper electrode 53. Here, the photo-receiving surface refers to the top area of intrinsic semiconductor material layer 63 and/or upper semiconductor material layer 65 of the P-I-N structure, which receives light incident on photo-receiving region 70. The dimensions of photo-receiving region 70, through which light enters the photodetector device, are further limited by the member, such as a case (not shown) of a photodetector device package.

In the present embodiment, substrate 50 is a semiconductor substrate formed of GaAs or InGaAs, which is doped to be n-type. Lower semiconductor material layer 61 and upper semiconductor material layer 65 are doped to be n-type and p-type, respectively. As shown in FIG. 3, photodetector device has a mesa 60, including upper semiconductor material layer 65, intrinsic semiconductor material layer 63 and just the top portion of lower semiconductor material layer 61. Here, mesa 60 may be formed by etching away the semiconductor material layers to the top portion of lower semiconductor material layer 61. Substrate 50 may be formed of Si.

The capacitance of a photodetector device, which influences the response speed of the device, depends upon the size of the upper electrode and the size of the photo receiving surface surrounded by the upper electrode. The reason why the capacitance of a photodetector device varies according to the size of the photo-receiving surface is that the photo-receiving surface is formed of a p-type doped upper semiconductor material layer, which has a high conductivity, thereby producing a comparatively high capacitance.

Thus, a feature of a photodetector device according to the present invention is that the structure of upper semiconductor material layer 65 is modified to lower the capacitance of the photodetector device while the size of the photo-receiving surface is maintained, which helps to achieve a high-speed response.

In the present embodiment, the size of upper semiconductor material layer 65, which contributes to the capacitance of the photodetector device, is reduced. Upper semiconductor material layer 65 is formed on a portion of intrinsic semiconductor material layer 63 to allow a portion of the incident light to directly enter intrinsic sa material layer 63, not through upper semiconductor material layer 65.

As shown in FIG. 3, upper semiconductor material layer 65 is formed on a portion of intrinsic semiconductor layer 63, just below upper electrode 53, so that intrinsic semiconductor material layer 63 is exposed as a photo-receiving surface 70a.

Alternatively, referring to FIG. 4, upper semiconductor material layer 65 may be left with a predetermined pattern on photo-receiving surface 70a, as well as being just below upper electrode 53. In this case, photo-receiving surface 70a consists of upper semiconductor material pattern 65' and exposed intrinsic semiconductor material layer 63. Here, the pattern and width of upper semiconductor material pattern 65', which constitutes part of photo-receiving surface 70a, can be varied as needed.

As explained in connection with the previous embodiments, the area of upper semiconductor material layer 65 can be reduced by changing the structure of upper semiconductor material layer 65, and thus the capacitance of the photodetector devices can be lowered while maintaining the same photo-receiving area, compared to conventional photodetector devices.

Referring back to FIGS. 3 and 4, an anti-reflection layer 71 may be further formed over photo-receiving surface 70a, so as to reduce reflection from photo-receiving layer 70a. Anti-reflection layer 71 is formed of one or more insulating layers made of $SiO_2$, $Si_3N_4$ or $ZrO_2$.

An insulating layer 73 may be further coated on the exposed side walls of mesa 60, the exposed surface of lower semiconductor material layer 61, and the top of upper electrode 53, except for a portion of upper electrode 53 for electrical contact, so as to suppress the occurrence of dark current. Alternatively, a polyimide layer (not shown) may be formed instead of insulating layer 73. Insulating layer 73 and anti-reflection layer 71 may be formed of the same material. In this case, insulating layer 73 and anti-reflection layer 71 are formed in the same process. For this reason, no boundary between insulating layer 73 and anti-reflection layer 71 is drawn in FIGS. 3 and 4.

In addition, a total-reflection layer 75 may be further coated on insulating layer 73, in order to shield the active region of the photodetector device, in particular, intrinsic semiconductor material layer 63, from exposure background emission, which causes noise within the region. Total-reflection layer 75 is formed of a metal such as aluminum (Al).

Figure 4:
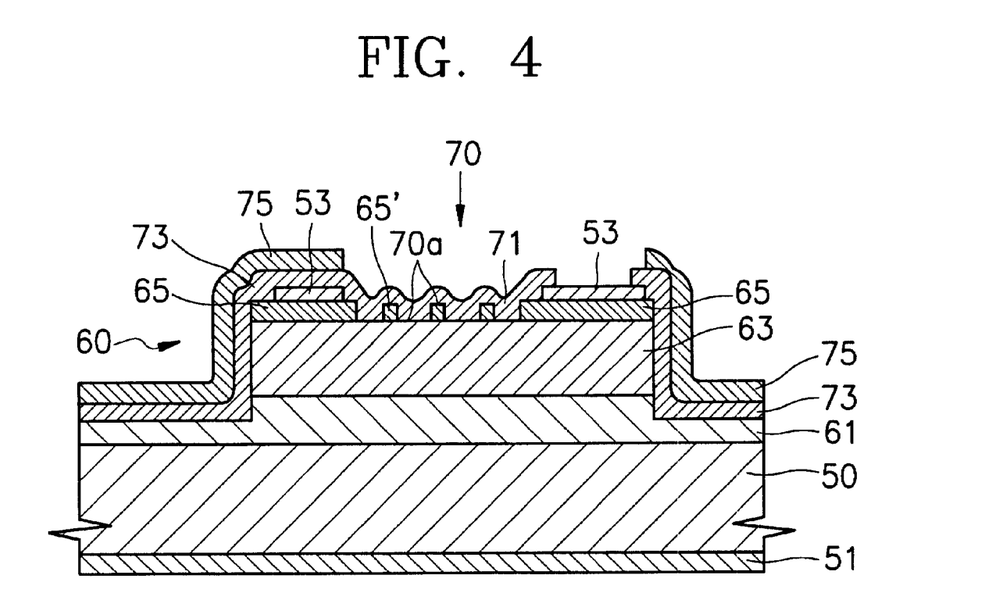
FIG. 4 is a sectional view showing an embodiment of a photodetector device constructed according to the principles of the present invention.
Figure 5:
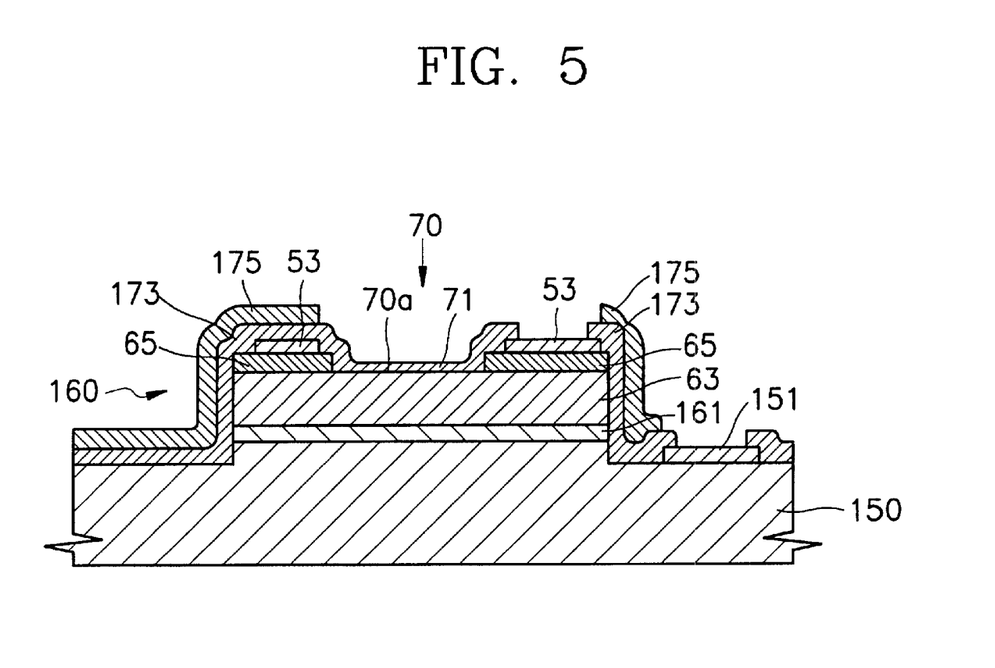
FIG. 5 is a sectional view showing an embodiment of a photodetector device constructed according to the principles of the present invention.
Figure 6:
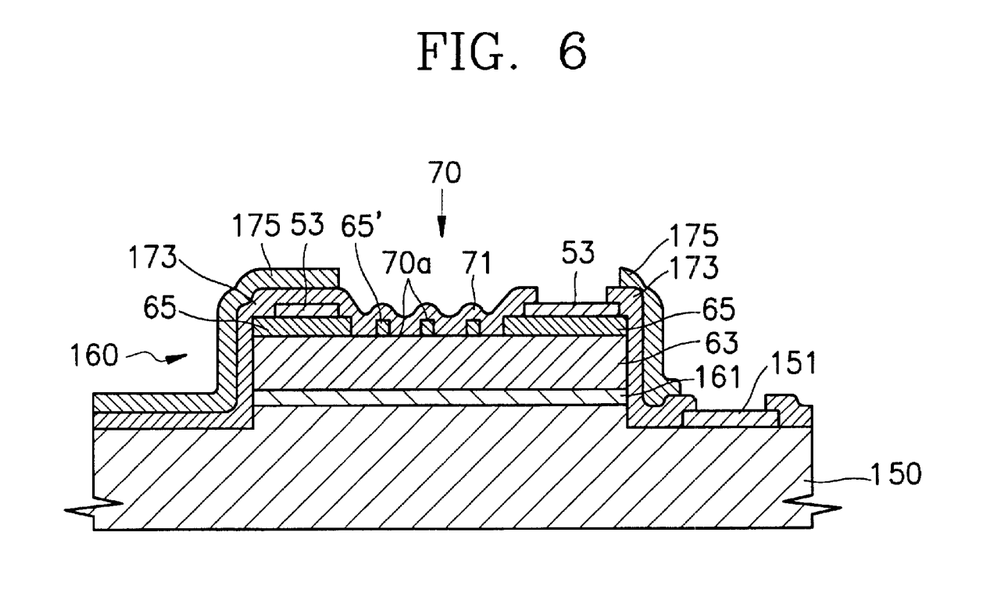
FIG. 6 is a sectional view showing an embodiment of a photodetector device constructed according to the principles of the present invention.

Further, in contrast to photodetector devices having lower electrode 51 on the back side of substrate 51 as shown in FIGS. 3 and 4, lower electrode 151 may be formed outside mesa 160, as shown in FIGS. 5 and 6. In particular, lower semiconductor material layer 161 is formed to be thinner than lower semiconductor material layer 61 of FIGS. 3 and 4, and mesa 160 has a depth which extends just inside substrate 150. Lower electrode 151 is formed on the exposed surface of substrate 150 around the outside of mesa 160. Here, it should be appreciated that a portion of lower electrode 151 for electrical contact is left uncoated by insulating layer 173 and total-reflection layer 175.

A photodetector device according to the present invention may be constructed such that the major region of the photodetector device, which is directly involved in photo-detection, is electrically separated from the other region. For example, a trench is formed around the outside of upper electrode 53 by etching the structure down to a portion of lower semiconductor material layer 61 or substrate 150. As a result, the photodetector device according to the present invention is constructed of mesa 60 or 160, and a peripheral region (not shown), which are spaced apart by the trench. Here, the peripheral region protects mesa 60 or 160 during the lapping on the back side of substrate 50 or 150. In addition, a photodetector device according to the present invention can be constructed in an array form for use in multi-channel signal transmission and reception.

In a photodetector device according to the present invention, having the above structure, when light enters photo-receiving surface 70a, intrinsic semiconductor material layer 65, which is the active region, absorbs the incident light to produce electrons and holes. Then, the holes migrate to upper electrode 53 while the electrons migrate to lower electrode 51 or 151, so that a current signal is detected.

Although the previous embodiments are described with reference to the P-I-N structure in which lower semiconductor material layer 61 or 161, intrinsic semiconductor material layer 63 and upper semiconductor material layer 65 are sequentially stacked on substrate 50 or 150, it should be appreciated that a P-I-N structure can be constructed to include only intrinsic semiconductor material layer 63 and upper semiconductor material layer 65 over substrate 50 or 150. In this case, lower electrode 51 or 151 is formed on the back side of substrate 50 or 150.

Figure 7A:
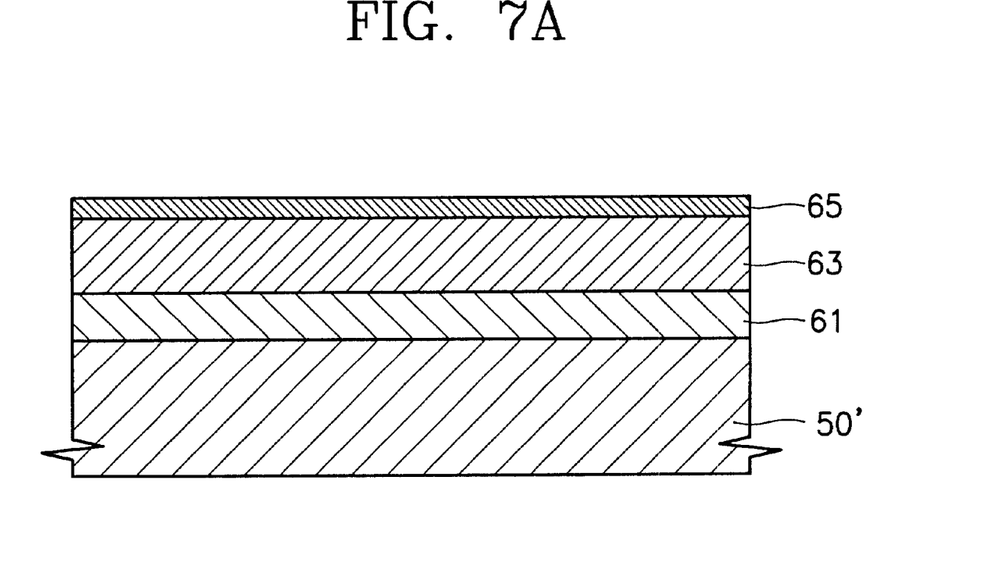
FIGS. 7A through 7F are sectional views illustrating a process of manufacturing a photodetector device according to the principles of the present invention.

A process for manufacturing a photodetector device according to the present invention will be described. As an example, the manufacture of the photodetector device shown in FIG. 3 is described with reference to FIGS. 7A through 7F. Referring to FIG. 7A, lower semiconductor material layer 61 is formed over substrate 51'. Then intrinsic semiconductor material layer 63 and upper semiconductor material layer 65 are sequentially deposited over lower semiconductor material layer 61. Here, reference numeral 50' denotes a state of the substrate before a lapping process, while reference numeral 50 in FIG. 3 represents the substrate after the lapping process.

Figure 7B:
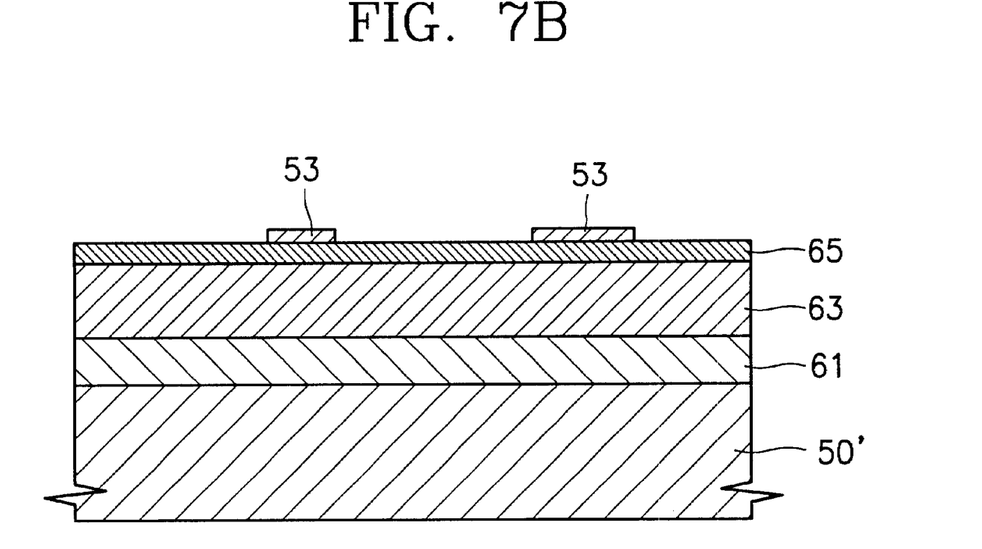

Following this, as shown in FIG. 7B, upper electrode 53, by which photo-receiving region 70 is limited, is formed with a predetermined pattern on upper semiconductor material layer 65.

Then, a portion of upper semiconductor material layer 65 of the inside of upper electrode 53, is subjected to etching to expose a portion of intrinsic semiconductor material layer 63, which serves as photo-receiving surface 70a. Here, upper semiconductor material layer 65 may be etched such that upper semiconductor material pattern 65' remains on photo-receiving surface 70a as shown in FIG. 4, to incorporate upper semiconductor material pattern 65' into photo-receiving surface 70a along with the exposed surface of intrinsic semiconductor material layer 63. Following this, mesa 60 is formed by etching around the outside of photo-receiving surface 70a, i.e., outside of upper electrode 63, to a depth which extends through upper semiconductor material layer 65, intrinsic semiconductor material layer 63, and at least a portion of lower semiconductor material layer 61.

Alternatively, after mesa 60 is completed, at least a portion of upper semiconductor material layer inside upper electrode 53 may be etched to expose a portion of intrinsic semiconductor material layer 63 to be photo-receiving surface 70a.

Figure 7C:
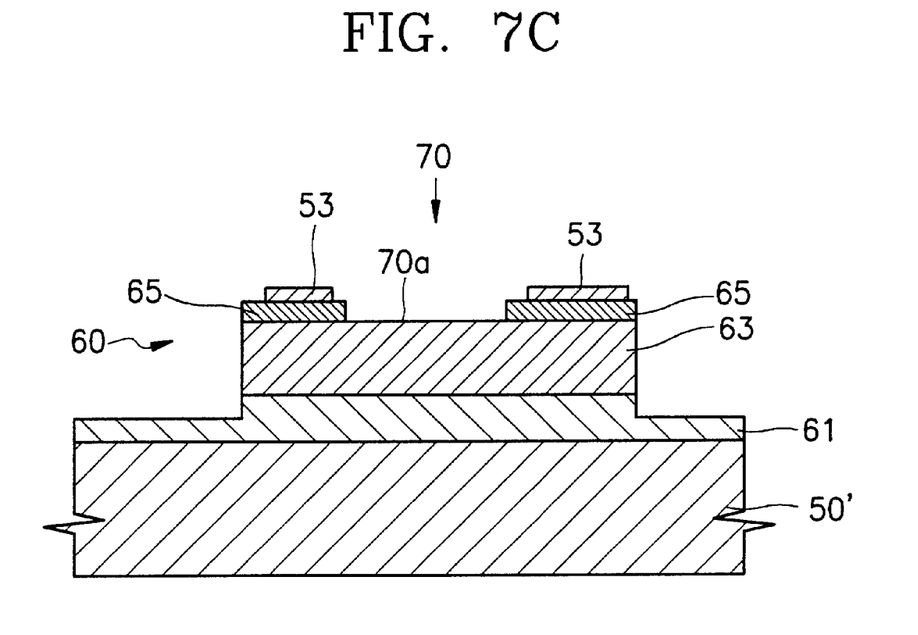
Figure 7D:
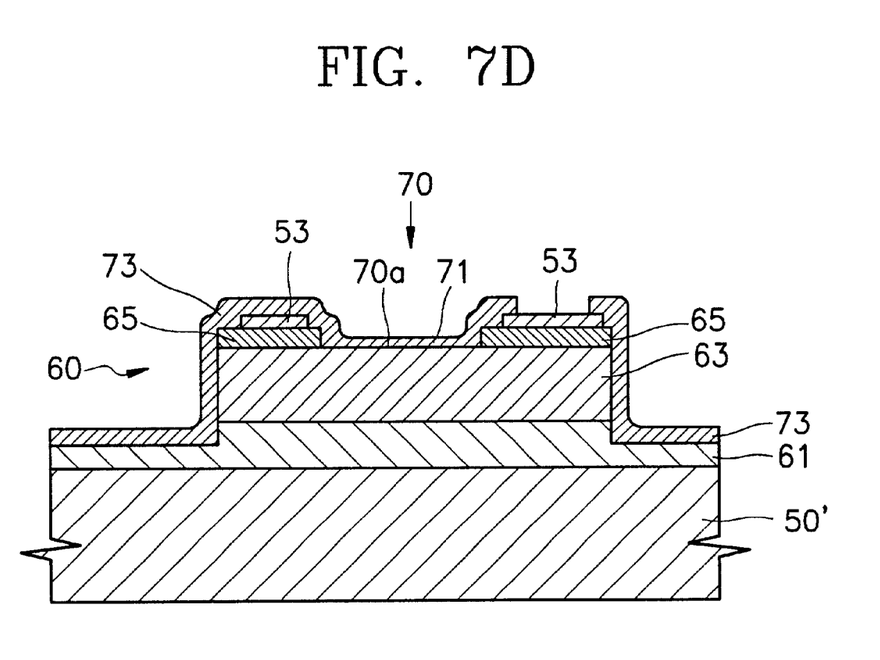

Referring to FIG. 7D, anti-reflection layer 71 is then formed over photo-receiving surface 70a. Then, upper electrode 53, except for a portion of upper electrode 53 for electrical contact, the exposed side walls of mesa 60, and the exposed surface of lower semiconductor material layer 61 around the outside of mesa 60, are covered with insulating layer 73. Where the same material is used for anti-reflection layer 71 and insulating layer 73, anti-reflection layer 71 and insulating layer 73 are simultaneously formed.

Figure 7E:
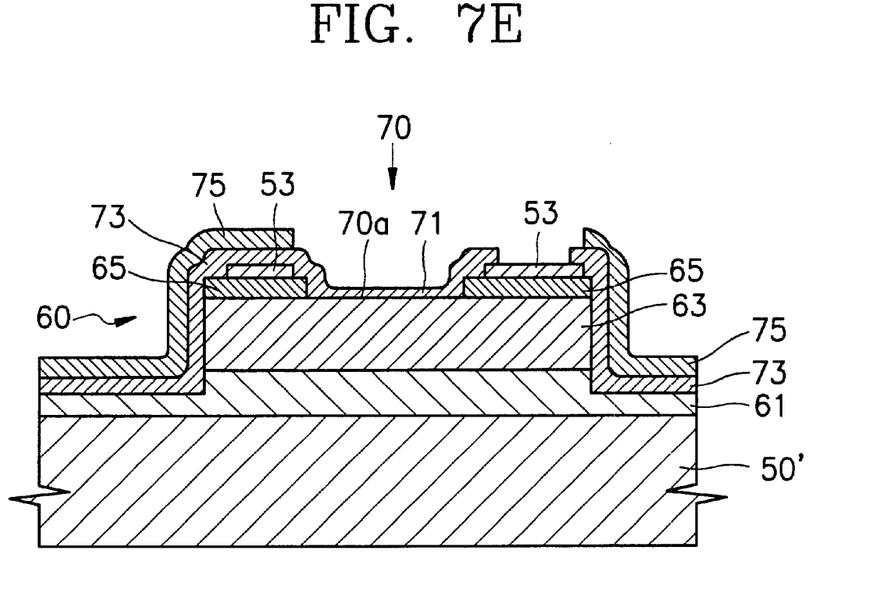
Figure 7F:
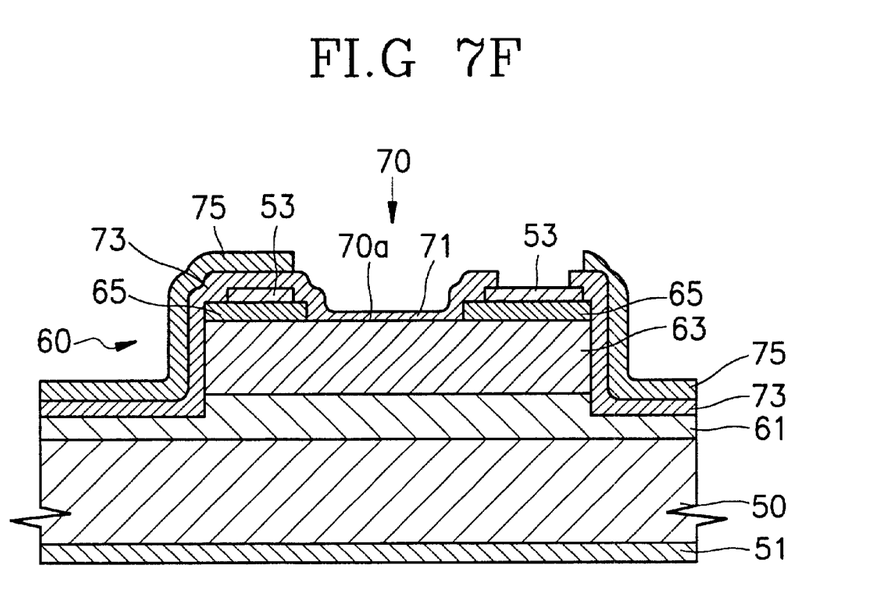

Following this, total reflection layer 75 is formed on insulating layer 73 as shown in FIG. 7E. After lapping substrate 50' to a predetermined thickness, lower electrode 51 is formed over the lapped back side of substrate 50, so that the photodetector device is completed as shown in FIG. 7F. The completed photodetector device is further subjected to a packaging process.

In the present embodiment, the manufacture of a photodetector device is described with particular reference to the photodetector device shown in FIG. 3. However, the manufacture of the photodetector device shown in FIG. 4 is similar to the previous embodiment except that upper semiconductor material layer 65 is etched to leave upper semiconductor material pattern 65' as a portion of photo-receiving surface 70a, which was described in conjunction with FIG. 4.

In regard to the device illustrated in FIGS. 5 and 6, where lower electrode 151 is formed on the exposed surface of substrate 150 around the outside of mesa 160, in the step described in conjunction with FIG. 7C, the etching is done into substrate 150 to form mesa 160. Then, lower electrode 51 is formed on the exposed surface of substrate 150 around mesa 160, followed by the formation of insulating layer 173 and total-reflection layer 175.

Figure 8:
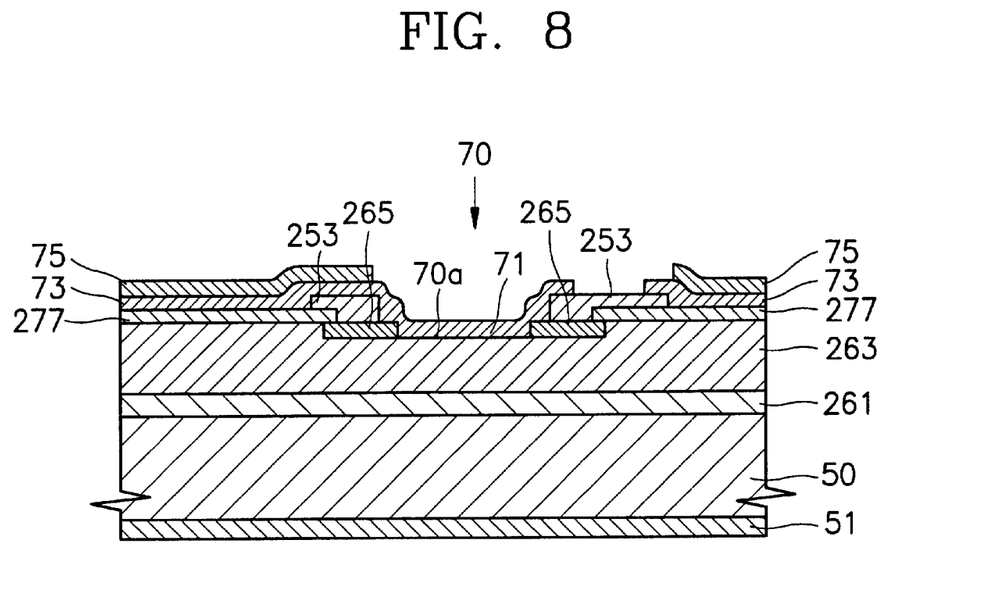
FIG. 8 is a sectional view showing another embodiment of a photodetector device constructed according to the principles of the present invention.

FIG. 8 is a sectional view showing another embodiment of a photodetector device according to the present invention. For convenience and clarity, like structures are denoted by the same reference numerals as in previous figures. The present embodiment has a P-I-N structure formed by diffusion over substrate 50, and a portion of upper semiconductor material layer 265 is etched such that at least a portion of photo-receiving surface 70a is formed of the exposed intrinsic semiconductor layer 263.

Figure 9:
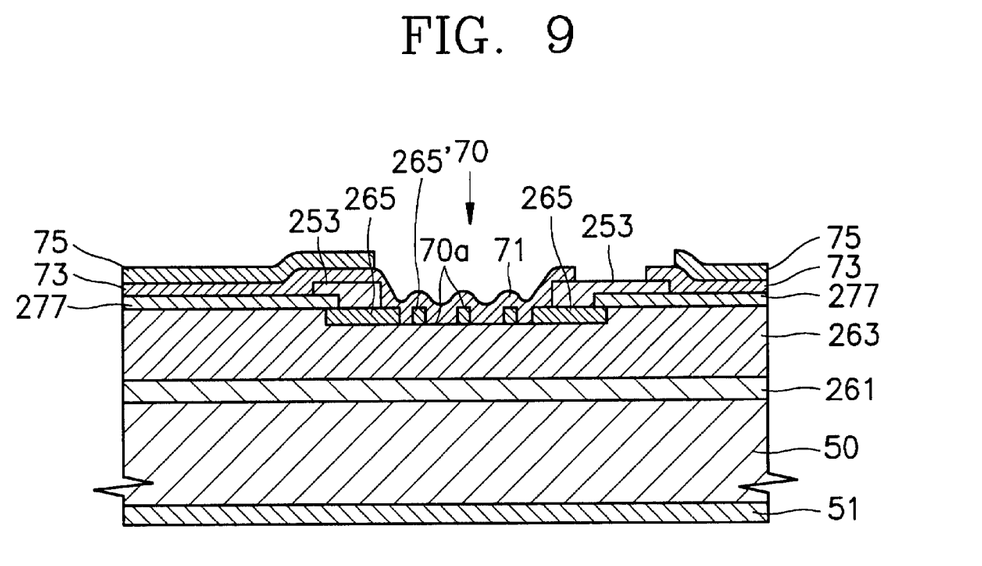
FIG. 9 is a sectional view showing another embodiment of a photodetector device constructed according to the principles of the present invention.

For example, lower semiconductor material layer 261 and/or intrinsic semiconductor material layer 263 are formed over substrate 50 by epitaxial growth all or diffusion. Then, upper semiconductor material layer 265 is formed into the top layer by diffusion. Upper semiconductor material layer 265 is etched away, except for a portion below upper electrode 253. The portion of intrinsic semiconductor material layer 263 which is exposed by the etching serves as photo-receiving layer 70a. Alternatively, as shown in FIG. 9, upper semiconductor material pattern 265' may be left after the etching to serve as photo-receiving layer 70a along with the exposed surface of intrinsic semiconductor material layer 263. In this case, where the P-I-N structure is formed by diffusion as previously mentioned, an insulating layer 277 is further formed between upper electrode 253 and intrinsic semiconductor material layer 263.

As described above, the photodetector device according to the present invention adopts a photo-receiving surface, which is formed by etching all or a portion of the upper semiconductor material layer within a photo-receiving area, to allow a portion of intrinsic semiconductor material layer underlying the upper semiconductor material layer to directly receive incident light, not through the upper semiconductor material layer. Thus, the photodetector device has low capacitance while keeping a relatively large photo-receiving surface.

Use of a high dielectric material, such as GaAs or InGaAs, as the substrate for a photodetector device according to the present invention enables a high-speed response with a relatively low voltage, even though the photo-receiving surface is relatively large.

The photodetector device according to the present invention is applicable in fields which need a high-speed response at a relatively low voltage level, for example, optical interconnections. In addition, because the photo-receiving surface is relatively large, sensitivity increases and alignment becomes easier, thereby sharply reducing the packaging cost. In addition, as persons skilled in this art will appreciate, this technology is capable of use in fabrication of other photoelectric or optoelectric semiconductor devices, such as thin-film transistor display devices.

A photodetector device according to the present invention, having the previously mentioned structure, can be manufactured using Si, which also enables a high-speed response with reduced capacitance, even through the photo-receiving surface is relatively large.

While the invention has been described in connection with specific and preferred embodiments thereof, it is capable of further modifications without departing from the spirit and scope of the invention. This application is intended to cover all variations, uses, or adaptations of the invention, following, in general, the principles of the invention and including such departures from the present disclosure as come within known or customary practice within the art to which the invention pertains, or as are obvious to persons skilled in the art, at the time the departure is made. It should be appreciated that the scope of this invention is not limited to the detailed description of the invention hereinabove, which is intended merely to be illustrative, but rather comprehends the subject matter defined by the following claims.

What is aimed is:

1. A semiconductor optoelectric device comprising:
   a doped semiconductor substrate;
   an intrinsic semiconductor material layer formed over the substrate, said layer adapted for absorbing incident light;
   an upper semiconductor material layer doped with the opposite type to the substrate, formed on a portion of the intrinsic semiconductor material layer in such manner as to allow at least a portion of the incident light to directly enter the intrinsic semiconductor material layer, said portion of the intrinsic semiconductor layer constituting at least a part of a photo-receiving surface;
   an upper electrode formed in a predetermined pattern on the upper semiconductor material layer, the upper electrode electrically connected to the upper semiconductor material layer; and
   a lower electrode electrically connected to the substrate.

2. The device of claim 1, wherein the upper semiconductor material layer is formed only below the upper electrode.

3. The device of claim 2, wherein the upper semiconductor material layer is formed in a predetermined pattern on the photo-receiving surface.

4. The device of claim 1, further comprising a lower semiconductor material layer doped to be the same type as the substrate, said layer located between the substrate and the intrinsic semiconductor material layer.

5. The device of claim 1, wherein the device has an elevated mesa projecting up from the substrate.

6. The device of claim 5, wherein the lower electrode is formed on the back side of the substrate or around the outside of the mesa.

7. The device of claim 1, further comprising an anti-reflection layer formed over the photo-receiving surface.

8. A semiconductor optoelectric device comprising:
   a doped semiconductor substrate;
   an intrinsic semiconductor material layer formed over the substrate, said layer adapted for absorbing incident light;
   an upper semiconductor material layer doped with the opposite type to the substrate, formed on a portion of the intrinsic semiconductor material layer in such manner as to allow at least a portion of the incident light to directly enter the intrinsic semiconductor material layer, said portion of the intrinsic semiconductor layer constituting at least a part of a photo-receiving surface;
   an upper electrode formed in a predetermined pattern on the upper semiconductor material layer, the upper electrode electrically connected to the upper semiconductor material layer;
   a lower electrode electrically connected to the substrate;
   an insulating layer formed over a region comprising exposed mesa side-walls, exposed surfaces of a lower semiconductor material layer, the photo-receiving surface, and the upper electrode, except for a portion of the upper electrode and the photo-receiving surface, said insulating layer adapted to suppress occurrence of dark current; and
   a reflection layer formed on the insulating layer, said reflection layer adapted to suppress occurrence of noise by background emission.

9. The device of claim 1, wherein the substrate is formed of GaAs, InGaAs, or Si.

10. A photodetector device, comprising:
    a doped semiconductor substrate;
    an intrinsic semiconductor material layer able to absorb incident light, formed over the substrate;
    an upper semiconductor material layer doped with the opposite type to the substrate, disposed on a portion of the intrinsic semiconductor material layer receiving at least a portion of the incident light directly entering the intrinsic semiconductor material layer, the portion of the intrinsic semiconductor material layer constituting at least a part of a photo-receiving surface; and
    an upper electrode formed with a predetermined pattern on the upper semiconductor material layer, the upper electrode being electrically connected to the upper semiconductor material layer.

11. The photodetector device of claim 10, comprising:
    the upper semiconductor material layer being disposed over the intrinsic semiconductor material layer; and
    a portion of the surface of the intrinsic semiconductor material layer being exposed by the upper semiconductor material layer to serve as at least a part of the photo-receiving surface.

12. The photodetector device of claim 11, comprised of the upper semiconductor material layer being etched to leave a portion of the upper semiconductor material layer below the upper electrode.

13. The photodetector device of claim 11, with the upper semiconductor material layer comprised of an upper semiconductor material pattern disposed on the photo-receiving surface, and a portion of the upper semiconductor material layer located below the upper electrode.

14. The photodetector device of claim 10, further comprising a lower semiconductor material layer doped with the same type as the substrate, disposed between the substrate and the intrinsic semiconductor material layer.

15. The photodetector device of claim 14, comprised of the lower semiconductor material layer, the intrinsic semiconductor material layer and the upper semiconductor material layer comprising epitaxially materials.

16. The photodetector device of claim 10, comprised of the intrinsic semiconductor material layer comprising an epitaxial growth or diffusion layer, and the upper semiconductor material layer comprising a diffusion layer.

17. The photodetector device of claim 10, further comprising an outside of the photo-receiving surface to forming a mesa projecting away from the substrate.

18. The photodetector device of claim 17, comprising a lower electrode formed on the back side of the substrate or around the outside of the mesa.

19. The photodetector device of claim 10, further comprising an anti-reflection layer over the photo-receiving surface.

20. The photodetector device of claim 10, further comprising:
- an insulating layer disposed over the region except for at least a portion of the upper electrode and the photo-receiving surface; and
- a reflection layer disposed on the insulating layer.

21. In a semiconductor photodetector device comprising:
- a doped semiconductor substrate having a high dielectric constant;
- an intrinsic semiconductor layer formed above the substrate;
- a semiconductor photo-receiving surface formed above the substrate and doped op-positely thereto, said surface having a predetermined photo-receiving area, a capacitance, and a response speed;

the improvement comprising:
- a means for increasing the photo-receiving area, for reducing the capacitance, and for increasing the response speed.

22. In a process for manufacturing a semiconductor photodetector device, said process comprising the steps of:
(1) providing a doped semiconductor substrate having a high dielectric constant;
(2) forming an intrinsic semiconductor layer above the substrate;
(3) forming a semiconductor photo-receiving surface above the substrate, said surface doped oppositely thereto and having a predetermined photo-receiving area, a capacitance, and a response speed;

the improvement comprising:

providing the semiconductor photo-receiving surface with a means for increasing the photo-receiving area, for reducing the capacitance, and for increasing the response speed.

* * * * *